United States Patent
Hirobe et al.

(10) Patent No.: US 7,456,681 B2
(45) Date of Patent: Nov. 25, 2008

(54) POWER SUPPLY VOLTAGE STEP-DOWN CIRCUIT, DELAY CIRCUIT, AND SEMICONDUCTOR DEVICE HAVING THE DELAY CIRCUIT

(75) Inventors: Atsunori Hirobe, Tokyo (JP); Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 219 days.

(21) Appl. No.: 11/360,522

(22) Filed: Feb. 24, 2006

(65) Prior Publication Data
US 2006/0192610 A1  Aug. 31, 2006

(30) Foreign Application Priority Data
Feb. 28, 2005  (JP)  ............... 2005-052463

(51) Int. Cl.
*G05F 1/10* (2006.01)
*G05F 3/02* (2006.01)

(52) U.S. Cl. ............ 327/543; 327/538; 327/540; 327/541

(58) Field of Classification Search ............ 327/261, 327/263, 264, 269, 270, 276–278, 538, 540, 327/541, 543
See application file for complete search history.

(56) References Cited
U.S. PATENT DOCUMENTS
6,624,680 B2 * 9/2003 Schenck ............ 327/262

| | | | |
|---|---|---|---|
| 7,042,266 B2 * | 5/2006 | Takahashi | 327/288 |
| 2004/0238875 A1 * | 12/2004 | Nakai | 257/314 |
| 2005/0179485 A1 * | 8/2005 | Iwase | 327/541 |
| 2005/0195020 A1 * | 9/2005 | Matsushita | 327/541 |

FOREIGN PATENT DOCUMENTS

| | | |
|---|---|---|
| JP | 61139025 A | 8/1986 |
| JP | 452914 A | 2/1992 |
| JP | 4-162113 A | 6/1992 |
| JP | 4248605 A | 9/1992 |
| JP | 5-12872 A | 1/1993 |
| JP | 695752 A | 4/1994 |
| JP | 778471 A | 3/1995 |
| JP | 786888 A | 3/1995 |
| JP | 9-8617 A | 1/1997 |
| JP | 2000357951 A | 12/2000 |
| JP | 2004-20325 A | 1/2004 |

* cited by examiner

*Primary Examiner*—Kenneth B. Wells
*Assistant Examiner*—John W Poos
(74) *Attorney, Agent, or Firm*—Sughrue Mion, PLLC

(57) ABSTRACT

A delay circuit has a circuit structure dominated by an NMOS or a PMOS transistor. The delay circuit is supplied with, as a power supply voltage, an output voltage of a power supply voltage step-down circuit having a level generating circuit for generating a reference voltage obtained by an offset voltage and a manufacturing variation dependent voltage, and an m-time voltage generating circuit. A semiconductor device includes the delay circuit.

10 Claims, 8 Drawing Sheets

POWER SUPPLY VOLTAGE STEP-DOWN CIRCUIT, DELAY CIRCUIT, AND SEMICONDUCTOR DEVICE HAVING THE DELAY CIRCUIT

This application claims priority to prior Japanese Patent Application JP 2005-52463, the disclosure of which is incorporated herein by reference.

BACKGROUND OF THE INVENTION

This invention relates to a delay circuit and, in particular, to a delay circuit suppressed in dependency upon variation in manufacturing conditions and a semiconductor device having the delay circuit.

A semiconductor device is more and more increased in capacity. In a dynamic random access memory (hereinafter abbreviated to DRAM), 1 Gbit DRAM is put into practical use. In such semiconductor device, use is made of an internal power supply voltage obtained by stepping down or dropping an external power supply voltage. However, in case where the internal power supply voltage is a step-down low voltage, delay times of internal circuits widely vary in response to variation in manufacturing conditions, for example, variation in transistor threshold voltage. Consequently, a delay time of a delay circuit in a timing generating circuit varies so that synchronization can not be established among the internal circuits. As a result, it is difficult to assure a stable operation of the semiconductor device.

In order to avoid the above-mentioned problems, Japanese Unexamined Patent Application Publication (JP-A) No. 2004-20325 (Reference 1) discloses a semiconductor device comprising multilevel voltage generating means for generating a plurality of voltages different in level from one another. An optimum one of the voltages is selected as a power supply voltage for an internal circuit to thereby correct a delay time of the internal circuit. Japanese Unexamined Patent Application Publication (JP-A) No. H09-8617 (Reference 2) discloses a delay control circuit for controlling a delay time of a delay circuit by comparing an external clock and an internal clock, controlling a charge pump circuit with reference to a result of comparison, and supplying the delay circuit with an output voltage of the charge pump circuit as a control signal. Japanese Unexamined Patent Application Publication (JP-A) No. H05-12872 (Reference 3) discloses a semiconductor memory comprising a selector for selecting one of a control signal and a delayed control signal as an internal control signal.

Japanese Unexamined Patent Application Publication (JP-A) No. H04-162113 (Reference 4) discloses a power supply voltage step-down circuit for detecting a difference between a reference voltage and a transistor threshold voltage and feeding back the difference to a power supply voltage so as to suppress variation in delay time due to temperature dependency and process dependency. Referring to FIGS. 1A to 3, description will be made of the technique disclosed in Reference 4.

Referring to FIG. 1A, a power supply voltage step-down circuit supplies an internal power supply voltage as a step-down voltage to a semiconductor circuit 63. In the power supply voltage step-down circuit, a reference voltage generating circuit 61 generates a reference voltage Vref. A differential amplifier 62 converts the reference voltage Vref to produce a low-impedance step-down voltage as an internal power supply voltage Vdd which is supplied to the semiconductor circuit 63 as a power supply voltage. By the differential amplifier 62, the internal power supply voltage Vdd comes close to the reference voltage Vref generated by the reference voltage generating circuit 61. Referring to FIG. 1B, the reference voltage Vref is set to be higher as a temperature is elevated and to be higher as the transistor threshold voltage of the reference voltage generating circuit is higher. On the other hand, when the power supply voltage is constant, a delay time is increased as the temperature is elevated and is increased as the transistor threshold voltage is higher. Therefore, as illustrated in FIG. 1C, if the reference voltage Vref is increased, an increase in delay time is prevented.

Referring to FIG. 2, a power supply voltage step-down circuit as one example is adaptable to variation in transistor threshold voltage. The voltage step-down circuit comprises a differential amplifier 73 supplied with a reference voltage Vi, an NMOS transistor 71 supplied with an output of the differential amplifier 73 as a gate input, a diode-connected PMOS transistor 72, and a constant current source 74. The differential amplifier 73 has another input supplied with a drain potential of the PMOS transistor 72. Therefore, the differential amplifier 73 produces an output voltage given by (Vi+Vtn+Vtp) and supplied as an internal power supply voltage. Thus, the internal power supply voltage is higher than the reference voltage Vi by the transistor threshold voltage Vtn of the NMOS transistor 71 plus the transistor threshold voltage Vtp of the PMOS transistor 72. When the threshold voltages are higher, the internal power supply voltage is higher so that an increase in delay time of an internal circuit is prevented.

Referring to FIG. 3, a power supply voltage step-down circuit as another example comprises a reference voltage generating circuit 81 having temperature dependency, a reference voltage generating circuit 82 dependent upon a transistor threshold voltage, a current source circuit 83, a step-down output circuit 84 for supplying a step-down voltage when a semiconductor device is operated, and a step-down voltage output circuit 85 for supplying a step-down voltage when the semiconductor device is in a standby state. A reference voltage is obtained by adding a temperature-dependent reference voltage produced by the temperature-dependent reference voltage generating circuit 81 and a threshold-voltage-dependent reference voltage produced by the reference voltage generating circuit 82 dependent upon the transistor threshold voltage. Thus, the reference voltage having temperature dependency and threshold voltage dependency is produced as an internal power supply voltage.

However, the variation in delay time due to the manufacturing variation is about 18%. Even when the power supply voltage step-down circuit of the above-mentioned publication (Reference 4) is used, the variation in delay time remains uncorrected although the improvement of about 10% is achieved. For example, a delay element operated at the power supply voltage of 1.4 V has variation in delay time as follows, In a SLOW model (an operation is slow, for example, when a Vt threshold voltage is high), the delay time is 3.10 ns. In a TYP model, the delay time is 2.86 ns. In a FAST model (an operation is quick, for example, when the Vt threshold voltage is low), the delay time is 2.63 ns. Thus, a delay difference between the SLOW model and the FAST model is about 18%. The delay difference of 18% must be controlled in an operation range to be compensated, such as variation in working conditions, like the variation in Vt of the transistor in a production process.

If the level Vtn+Vtp+Vi (Vi is a fixed potential) in the above-mentioned Reference 4 Is used in order to control the delay difference, improvement of about 10% is obtained. Since a potential dependent upon the threshold voltages (Vtn and Vtp) is used as a potential of an internal step-down voltage, the dependency upon the level of Vtn and Vtp is about 10%. If the above-mentioned level is directly used as a power supply level for the delay circuit, the improvement is insufficient, Accordingly, further improvement is necessary.

As described above, even if the internal power supply voltage dependent upon the transistor threshold voltages is used, the variation in delay time remains uncorrected. For example, a sense timing related to tRCD of a DRAM can be reduced in power supply voltage dependency by the use of an internal constant voltage. However, use of the internal voltage results in a low potential (about 1.4V in case of a 1.8 V product). Therefore, the dependency upon the variation in transistor characteristics of the delay circuit is increased to the contrary.

SUMMARY OF THE INVENTION

It is an object of this invention to provide a power supply voltage step-down circuit which supplies a delay circuit with a power supply voltage which makes it possible to correct variation in delay time due to manufacturing variation of transistors of the delay circuit.

It is another object of this invention to provide a delay circuit in which variation is corrected in delay time due to manufacturing variation of transistors of the delay circuit.

It is still another object of this invention to provide a semiconductor device comprising a delay circuit and a power supply voltage step-down circuit which supplies the delay circuit with a power supply voltage which makes it possible to correct variation in delay time due to manufacturing variation of transistors of the delay circuit.

Power supply voltage step-down circuits according to this invention, delay circuits according to this invention, and semiconductor devices according to this invention are as follows:

(1) A power supply voltage step-down circuit comprising a level generating circuit for generating a reference voltage obtained by adding an offset voltage and a manufacturing variation dependent voltage and a m-time voltage generating circuit for producing a voltage obtained by multiplying the reference voltage by m, where m is a positive number.

(2) The power supply voltage step-down circuit as described in (1), wherein the manufacturing variation dependent voltage is equal to n times a threshold voltage of a MO$ transistor, where n is a positive integer.

(3) The power supply voltage step-down circuit as described in (1), wherein the level generating circuit comprises a differential amplifier and an output stage, the output stage comprising a transistor supplied with an output of the differential amplifier, a plurality of transistors, n (n being a positive integer) in number, each of which is diode-connected, and a constant current source, the transistors, the diode-connected transistors, and the constant current source being connected in sequence between a power supply voltage and an internal power supply voltage, the differential amplifier being supplied with the offset voltage and a potential of a connection point of the constant current source and the diode-connected transistors.

(4) The power supply voltage step-down circuit as described in (1), wherein the m-time voltage generating circuit comprises a differential amplifier and an output stage, the output stage comprising a transistor supplied with an output of the differential amplifier and resistors, the differential amplifier being supplied with an output of the level generating circuit and a potential of a split node of the resistors.

(5) A delay circuit comprising a plurality of stages of inverter circuits in each of which a delay time is dominated by a PMOS or an NMOS transistor, the inverter circuits being supplied with, as a power supply voltage, a voltage obtained by adding an offset voltage and a manufacturing variation dependent voltage to produce a reference voltage and multiplying the reference voltage by m, where m is a positive number.

(6) A delay circuit comprising a plurality of stages of inverter circuits in each of which a delay time is dominated by a PMOS or an NMOS transistor, the A inverter circuits being supplied with, as a power supply voltage, an output voltage from a power supply voltage step-down circuit comprising a level generating circuit for generating a reference voltage obtained by adding an offset voltage and a manufacturing variation dependent voltage and a m-time voltage generating circuit for producing a voltage obtained by multiplying the reference voltage by m, where m is a positive number.

(7) The delay circuit as described in (6), wherein the power supply voltage step-down circuit determines the offset voltage and the value of m from a power supply voltage value at which the delay time is substantially same in a manufacturing variation best condition and a manufacturing variation worst condition, the power supply voltage step-down circuit producing a high power supply voltage in a condition that the delay time of the delay circuit is large and a lower power supply voltage in a condition that the delay time of the delay circuit is small.

(8) The delay circuit as described in (6), wherein the manufacturing variation dependent voltage is equal to n times a threshold voltage of the MOS transistor dominating the delay time of the delay circuit, where n is a positive integer.

(9) A semiconductor device comprising a delay circuit and a power supply voltage step-down circuit, the delay circuit comprising a plurality of stages of inverter circuits in each of which a delay time is dominated by a PMOS or an NMOS transistor, the power supply voltage step-down circuit comprising a level generating circuit for generating a reference voltage obtained by adding an offset voltage and a manufacturing variation dependent voltage and a m-time voltage generating circuit for producing a voltage obtained by multiplying the reference voltage by m, where m is a positive number, the delay circuit being supplied with, as a power supply voltage, an output voltage of the power supply voltage step-down circuit.

(10) The semiconductor device as described in (9), wherein a sense amplifier activation signal is delayed by the delay circuit.

In this invention, the delay circuit has a circuit structure in which the NMOS or the PMOS transistor is predominant. The power supply voltage step-down circuit comprises the level generating circuit for producing the reference voltage as a sum of the offset voltage and the voltage dependent upon manufacturing variation and the m-time voltage generating circuit. The output voltage of the power supply voltage step-down circuit is used as the power supply voltage for the delay circuit. Thus, the delay circuit prevented from variation in delay time due to manufacturing variation and the semiconductor device having the delay circuit are obtained.

DESCRIPTION OF THE PREFERRED EMBODIMENT

Figure 1A:
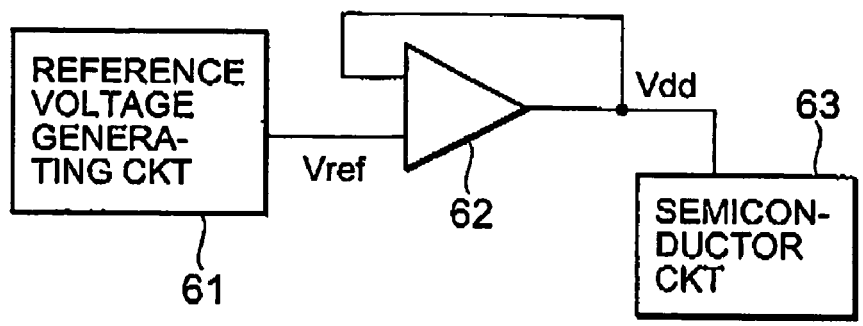
FIGS. 1A through 1C are views for describing a conventional technique.
Figure 1B:
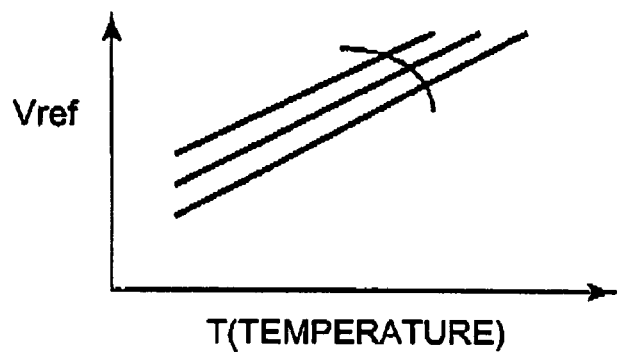
Figure 1C:
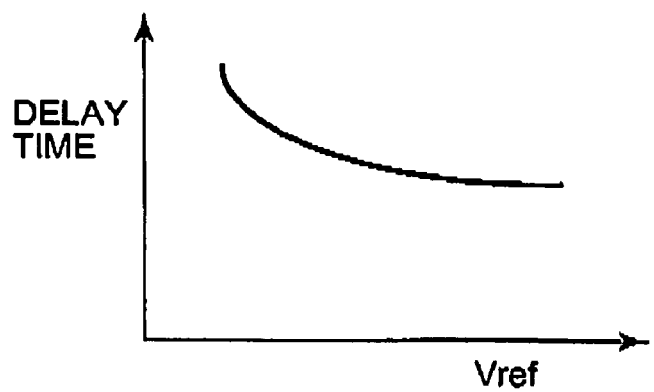
Figure 2:
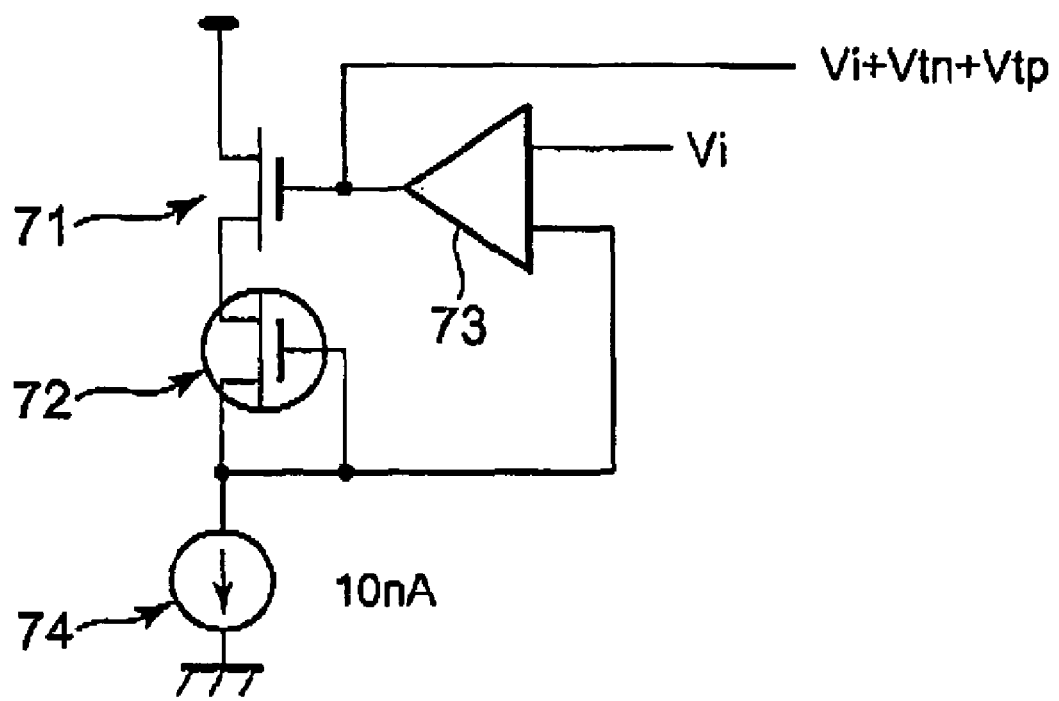
FIG. 2 is a circuit diagram of a first example of the conventional technique.
Figure 3:
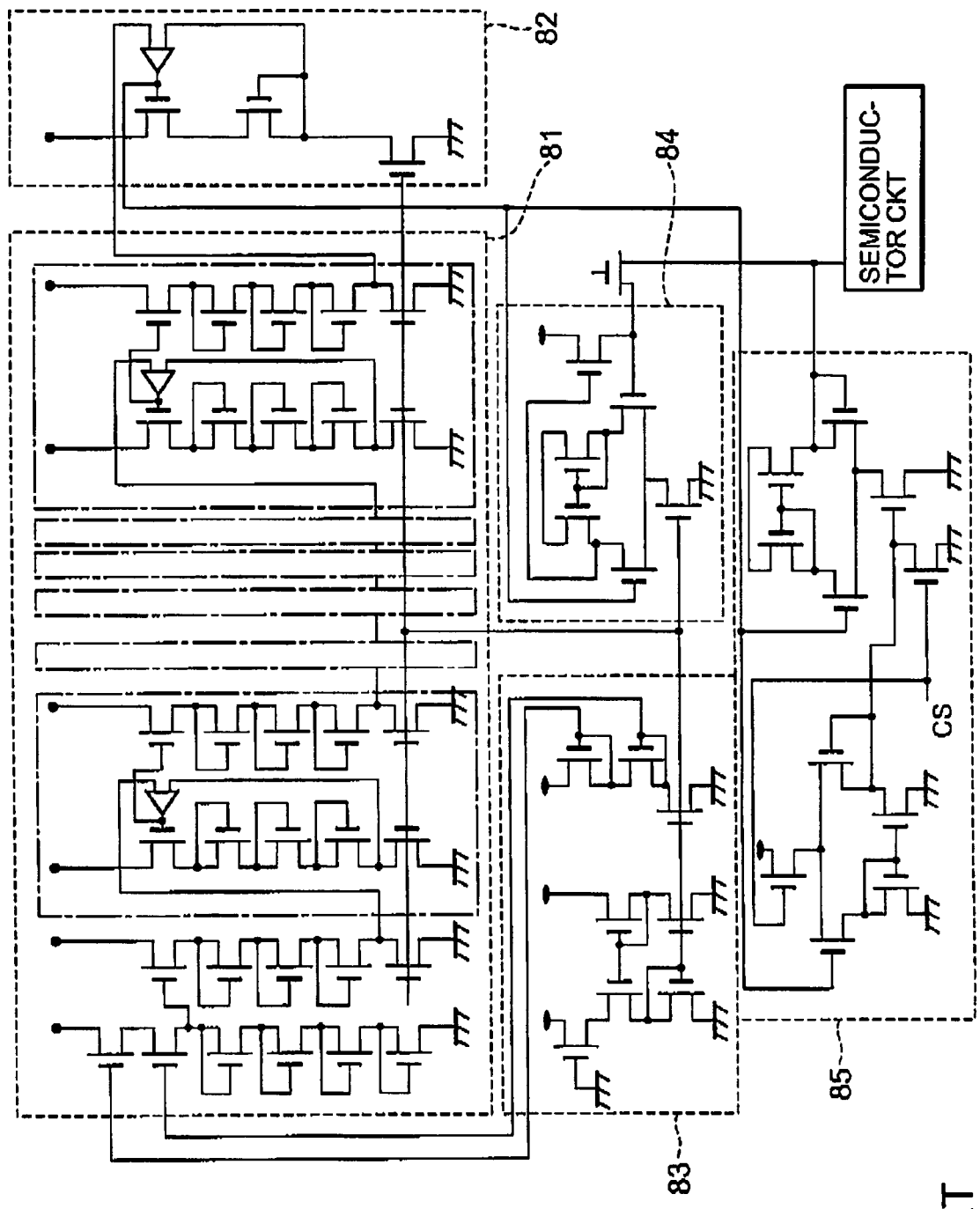
FIG. 3 is a circuit diagram of a second example of the conventional technique.

Now, this invention will be described in detail with reference to the drawing.

First Embodiment

Referring to FIGS. 4 to 7, a first embodiment of this invention will be described.

Figure 4:
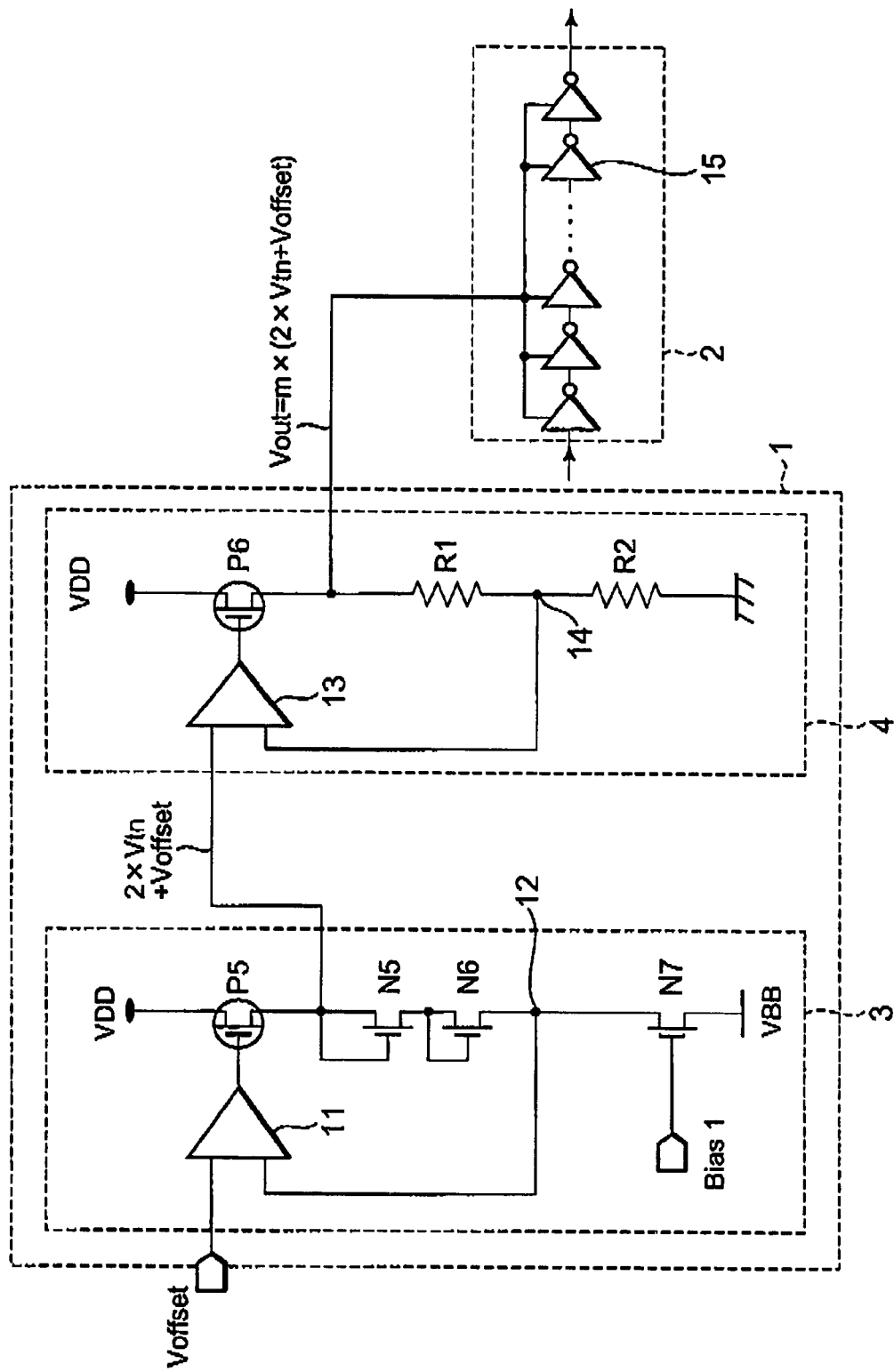
FIG. 4 is a block diagram of a first embodiment of this invention.

As illustrated in FIG. 4, a semiconductor device according to this invention comprises a power supply voltage step-down circuit 1 and a delay circuit 2. The power supply voltage step-down circuit 1 comprises a level generating circuit 3 and an m-time voltage generating circuit 4 and is connected to the delay circuit 2. The level generating circuit 3 is supplied with an offset voltage Voffset and produces an output voltage (2×Vt+Voffset) which is delivered to the m-time voltage generating circuit 4. Supplied with the output voltage (2×Vt+Voffset) as an input voltage, the m-time voltage generating circuit 4 multiplies the input voltage by m to produce an m-time output voltage m×(2×Vt+Voffset) which is supplied to the delay circuit 2 as a power supply voltage.

The level generating circuit 3 comprises a differential amplifier 11, a transistor P5, and transistors N5, N6, and N7. Hereinafter, each PMOS transistor is designated by a reference numeral preceded by P while each NMOS transistor is designated by a reference numeral preceded by N. The differential amplifier 11 is supplied with the offset voltage Voffset and a node 12 as a connection point of a source of the transistor N6 and a drain of the transistor N7 and produces an output supplied to a gate of the transistor P5.

A drain, a source, and the gate of the transistor P5 are connected to a drain of the transistor N5, an external power supply VDD, and the output of the differential amplifier 11, respectively. The drain, a source, and a gate of the transistor N5 are connected to the drain of the transistor P5, a drain of the transistor N6, and the drain of the transistor P5, respectively. The drain, the source, and a gate of the transistor N6 are connected to the source of the transistor N5, the drain of the transistor N7, and the drain of the transistor N6, respectively. The drain, a source, and a gate of the transistor N7 are connected to the source of the transistor N6, an internal power supply voltage VBB, and a bias voltage Bias1, respectively.

The transistor N7 is a constant current source circuit supplied with the bias voltage Bias1 as a gate input. As a current starting to flow when the transistor is turned on, a constant current of, for example, 10 nA is set. Therefore, voltage step-down at each of the transistors N5 and N6 diode-connected corresponds to a threshold voltage thereof. Since the differential amplifier 11 is supplied with the offset voltage Voffset and the node 12, the drain of the transistor P5 as the output of the level generating circuit 3 produces an output voltage (2×Vtn+Voffset) obtained by adding the threshold voltages Vtn of the transistors N5 and N6 to the offset voltage Voffset. Herein, the transistors N5 and N6 are similar to those used in the delay circuit and have same transistor characteristics.

In this embodiment, a two-stage structure comprising the transistors N5 and N6 is used. Alternatively, an n-stage structure may be used to produce an output voltage (n×Vtn+Voffset). Instead of the NMOS transistors, PMOS transistors similarly diode-connected may be used to produce an output voltage (n×Vtp+Voffset). Whether the NMOS transistors or the PMOS transistors are used is determined depending upon on which transistor has a transistor ability predominant in a delay time of the delay circuit. For example, if the NMOS transistors are predominant, the NMOS transistors are connected.

Generally, the delay circuit is dominated by both of the NMOS and the PMOS transistors. In this case, the threshold voltages Vtn and Vtp are added to the reference potential. However, if the delay time is dominated by the transistors of both types, the delay time is dependent upon the transistor characteristics of both the NMOS and the PMOS transistors. Therefore, a structure for satisfying both characteristics is complicated. In view of the above, the delay time is preferably dominated by one type of the MOS transistors.

The m-time voltage generating circuit 4 comprises a differential amplifier 13, a transistor P6, and resistors R1 and R2. The m-time voltage generating circuit 4 is supplied with an input voltage (2×Vtn+Voffset), has an output terminal at a connection point of a drain of the transistor P6 and the resistor R1, and produces an output voltage m×(2×Vtn+Voffset) obtained by multiplying the input voltage by m. The differential amplifier 13 is supplied with the output voltage (2×Vtn+Voffset) from the level generating circuit 3 and a node 14 as a connection point of the resistors R1 and R2 and produces an output which is supplied to a gate of the transistor P6. The drain, a source, and the gate of the transistor P6 are connected to one terminal of the resistor R1, an external power supply VDD, and the output of the differential amplifier 13, respectively. The resistor R1 has the one terminal connected to the drain of the transistor P6 and the other terminal connected to one terminal of the resistor R2. The resistor R2 has one terminal connected to the other terminal of the resistor R1 and the other terminal connected to a ground potential GND. Herein, a dividing (or split) ratio of the resistors R1 and R2 is given by m=(R1+R2)/R2 so that an output voltage Vout is equal to m times the input voltage (2×Vtn+Voffset).

The delay circuit 2 comprises a plurality of inverters 15 connected to one another. An input signal supplied to a first-stage inverter is delayed and outputted from a last-stage inverter. The delay circuit 2 is supplied with the output voltage Vout from the m-time voltage generating circuit 4 as a power supply voltage.

Figure 5:
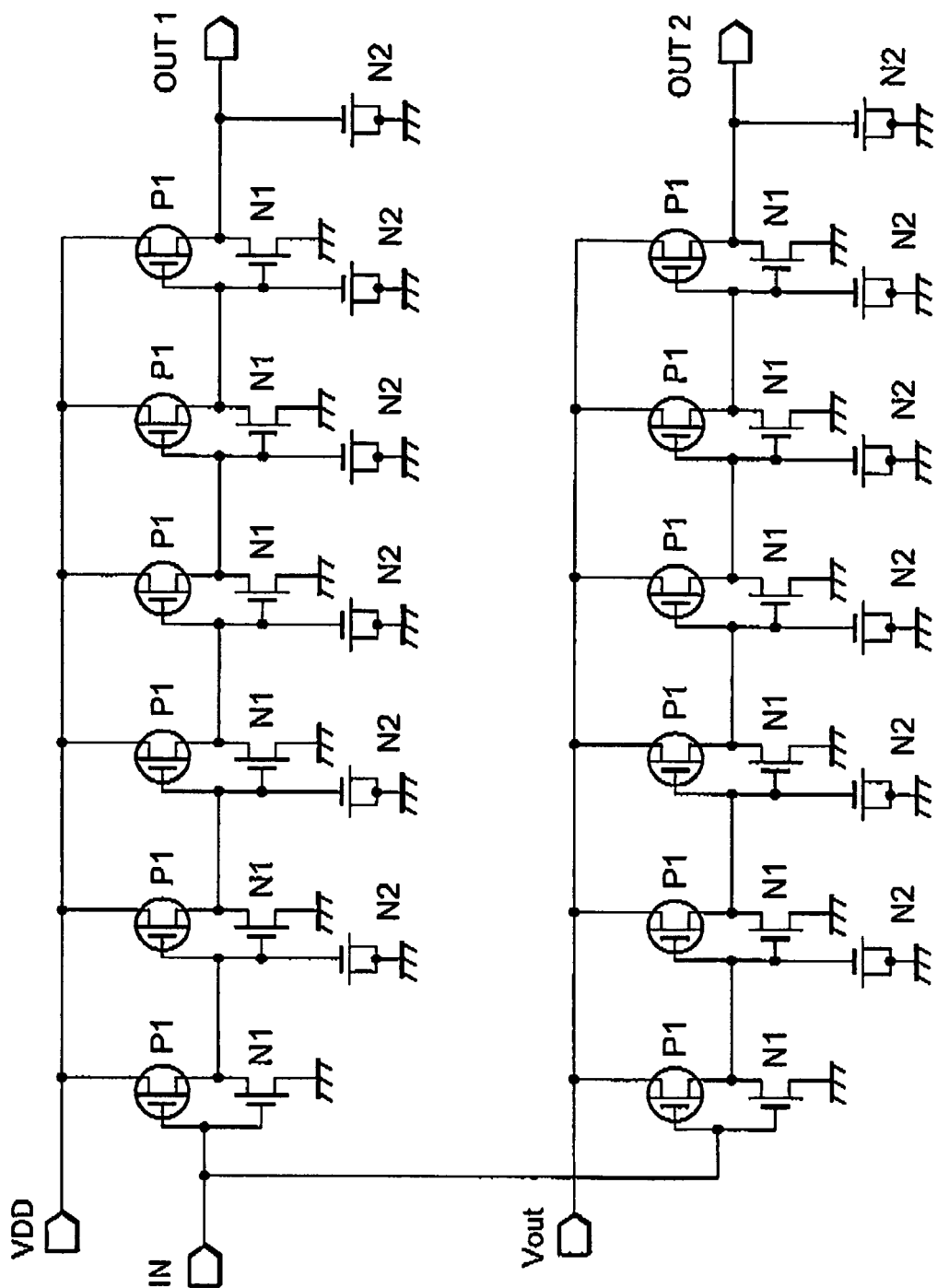
FIG. 5 is a circuit diagram of a delay circuit illustrated in FIG. 4.

The delay circuit illustrated in FIG. 5 comprises an upper-stage inverter chain and a lower-stage inverter chain. Each of the upper-stage inverter chain and the lower-stage inverter chain comprises six inverters each of which comprises a load transistor P1 and a driver transistor N1 and which are connected to one another. A transistor N2 having a drain and a source connected in common to the ground is a load capacitance of each inverter. The upper-stage inverter chain is supplied with a power supply voltage VDD from an outside. The lower-stage inverter chain is supplied with the output voltage Vout from the power supply voltage step-down circuit 1 illustrated in FIG. 4. Herein, by making the transistor N1 have a drivability smaller than that of the transistor P1, the delay circuit in which the ability of the NMOS transistor N1 is predominant can be formed. For example, it is assumed that the transistor P1 has a gate width of 5 μm and a gate length of 0.24 μm, that the transistor N1 has a gate width of 2 μm and a gate length of 0.48 μm, and that the transistor N2 has a gate width of 5 μm and a gate length of 5 μm. In this event, the delay time of the delay circuit is dominated by the ability of the transistor N1. Herein, one of the transistors is dominant if the ability of the transistor is about 3 times or more.

It is assumed that the delay time of the delay circuit is dominated by the transistors N5 and N6 of the level generating circuit 3 in FIG. 4. On the contrary, in order that the delay time of the delay circuit is dominated by the ability of the PMOS transistor, the transistor N1 has a gate width of 5 μm and a gate length of 0.24 μm and the transistor P1 has a gate width of 2 μm and a gate length of 0.48 μm. Instead of the transistors N5 and N6 in FIG. 4, the PMOS transistors diode-connected are used.

Figure 6:
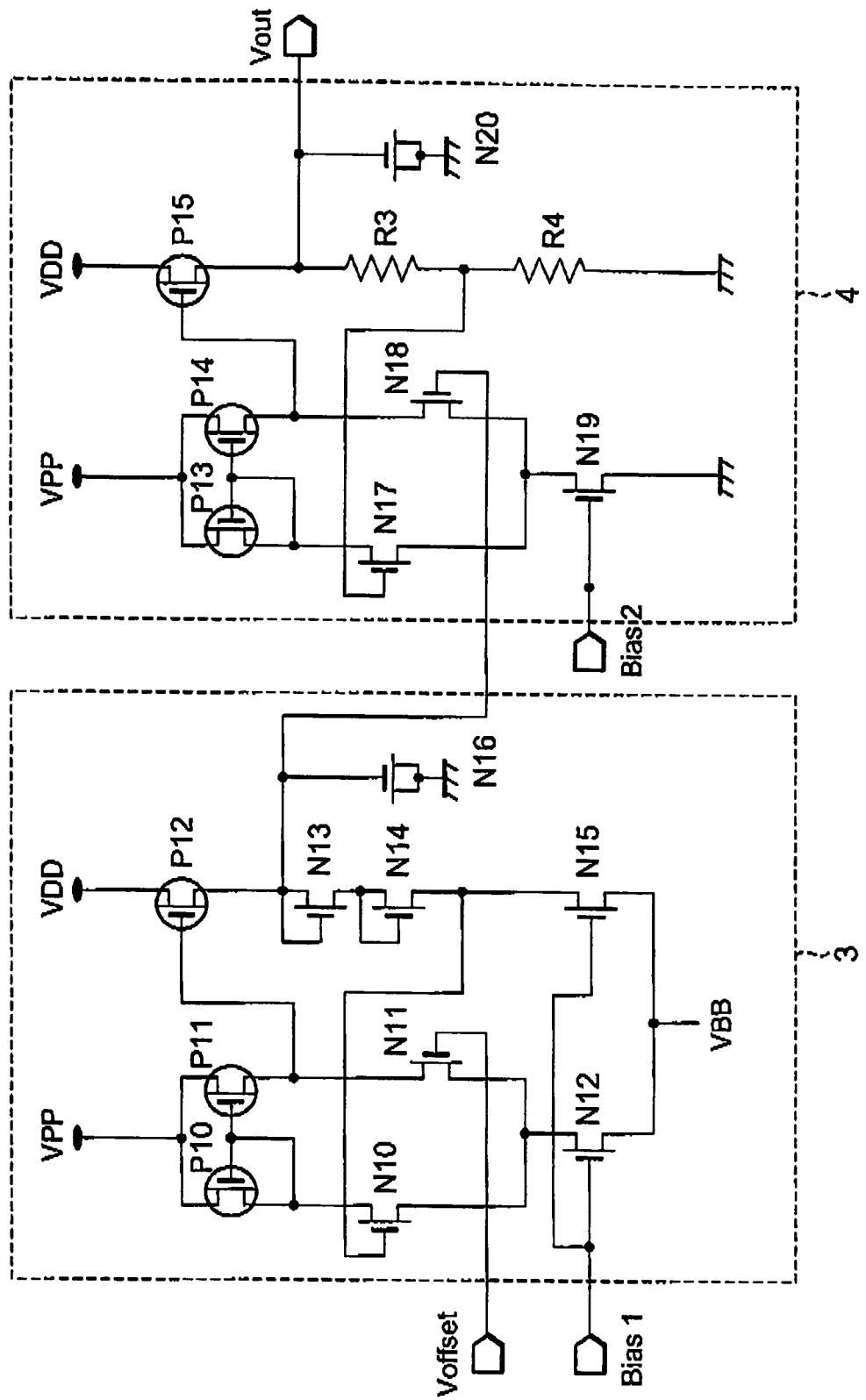
FIG. 6 is a circuit diagram of a level generating circuit and a power supply voltage generating circuit in FIG. 4.

Referring to FIG. 6, the level generating circuit 3 and the m-time voltage generating circuit 4 of the power supply voltage step-down circuit 1 are illustrated in a circuit diagram of a transistor level. In comparison with FIG. 4, description will be made. The differential amplifier 11 of the level generating circuit 3 comprises transistors P10 and P11 and transistors N10, N11, and N12, An output stage comprises a transistor P12 and transistors N13, N14, and N15.

A drain, a source, and a gate of the transistor P10 of the differential amplifier 11 are connected to a drain of the transistor N10, to an internal step-up voltage VPP, and to a gate of the transistor P11 and the drain of the transistor P10, respectively. A drain, a source, and the gate of the transistor P11 are connected to a drain of the transistor N11, to the internal step-up voltage VPP, and to the gate of the transistor P10, respectively. The drain, a source, and a gate of the transistor N10 are connected to the drain of the transistor P10, to a drain of the transistor N12, and to a source of the transistor N14 and a drain of the transistor N15, respectively. The drain, a source, and the gate of the transistor N11 are connected to the drain of the transistor P11, to the drain of the transistor N12, and to the offset voltage Voffset, respectively. The drain, a source, and a gate of the transistor N12 are connected to the sources of the transistors N10 and N11, to the internal power supply voltage VBB, and to the bias voltage Bias1, respectively.

A drain, a source, and a gate of the transistor P12 at the output stage of the level generating circuit 3 are connected to a drain of the transistor N13, to the external power supply voltage VDD, and to the drain of the transistor P11 as an output of the differential amplifier 11, respectively. The drain, a source, and a gate of the transistor N13 are connected to the drain of the transistor P12, to a drain of the transistor N14, and to the drain of the transistor N13, respectively. The drain, the source, and a gate of the transistor N14 are connected to the source of the transistor N13, to the drain of the transistor N15, and to the drain of the transistor N14, respectively. The drain, a source, and a gate of the transistor N15 are connected to the source of the transistor N14, to the internal power supply voltage VBB, and to the bias voltage Bias1, respectively. A transistor N16 having a drain and a source connected in common to the ground potential GND and a gate connected to the output of the level generating circuit 3 is a load capacitance.

The differential amplifier 11 is supplied with the offset voltage Voffset and a source potential of the transistor N14 of the output stage and produces an output delivered to the gate of the transistor P12. The transistor P12 is a constant current source. The transistors P12, N13, N14, and N15 of the output stage are similar in structure and operation to the transistors P5, N5, N6, and N7 in FIG. 4, respectively. The level generating circuit 3 is supplied with the offset voltage Voffset and produces an output voltage (n×Vt+Voffset). In FIG. 6, as transistors for which threshold voltages are to be detected, the NMOS transistors N13 and N14 are diode-connected in two stages. Therefore, n is equal to 2. Herein, n is a positive integer. As a high power supply voltage of the differential amplifier, the internal step-up power supply VPP is used. As a low power supply voltage, the internal power supply voltage VBB including a negative potential is used. This is because the offset voltage can freely be selected. For example, if the low power supply voltage is the ground potential GND, the power supply voltage step-down circuit is not operable in case where the offset voltage is a low voltage. In case where the offset voltage is high, the ground potential GND may be used.

The differential amplifier 12 of the m-time voltage generating circuit 4 comprises transistors P13 and P14 and transistors N17, N18, and N19. An output stage comprises a transistor P15 and resistors R3 and R4. A transistor N20 having a drain and a source connected in common to the ground potential GND and a gate connected to the output of the level generating circuit is a load capacitance. The m-time voltage generating circuit 4 multiplies an input voltage (2×Vt+Voffset) to produce an output voltage Vout given by m×(n×Vt+Voffset). The structure and the operation of the differential amplifier 12 and the output stage are similar to those described above and, therefore, detailed description thereof will be omitted.

Herein, the transistors P10 and P11 are same in transistor size to each other so that their transistor characteristics are same. This also applies to the transistors N10 and N11, the transistors P13 and P14, and the transistors N17 and N18. The transistors N13 and N14 are same in transistor size to the transistor N1 dominating the delay time of the delay circuit. The ratio of the resistors R3 and R4 is selected so that the output voltage is m times.

Figure 7:
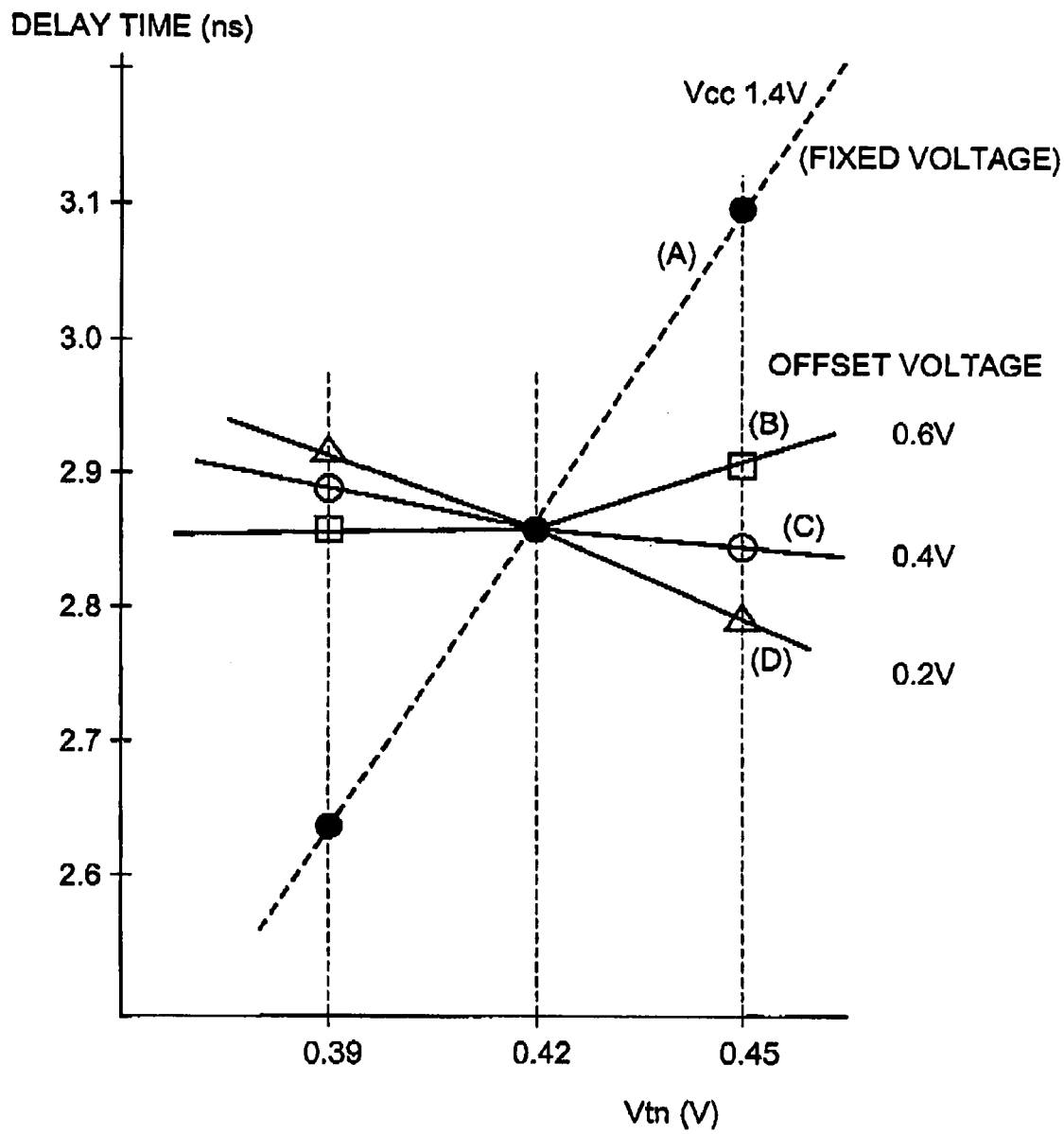
FIG. 7 is a view showing correlation between manufacturing variation and a delay time in the first embodiment.

Referring to FIG. 7, description will be made of correlation between an actual power supply voltage and the delay time of the delay circuit in the above-mentioned circuit structure. In the delay circuit 2, the transistor N1 has a channel width of 2 μm and the channel length of 0.48 μm. The delay time is dominated by the transistor N1. As the power supply voltage, the output voltage Vout from the power supply voltage step-down circuit is supplied. Consideration will be made of the case where the threshold voltage Vtn is 0.42 V±0.3 V as manufacturing variation and the power supply voltage is fixed at 1.4 V. In this event, the delay time is 2.63 ns (Vtn=0.39 V) in a FAST model, 2.86 ns (Vtn=0.42 V) in a TYP model, and 3.10 ns.(Vtn=0.45V) in a SLOW model. Thus, the variation in delay time is 18%.

The output voltage Vout from the power supply voltage step-down circuit in this embodiment is supplied to the delay circuit. The offset voltage is calculated as follows. The power supply voltage without the variation in delay time with respect to each threshold voltages is obtained by actual measurement or simulation. The offset voltage and m are determined so that the power supply voltage ratio between the SLOW model (Vtn=0.45 V) and the FAST model (Vtn=0.39 V) is equal to the (2×Vtn+Voffset) ratio between the SLOW model (Vtn=0.45 V) and the FAST model (Vtn=0.39 V). In the SLOW mode (Vtn=0.45 V), the delay time is equal to that in TYP (Vtn=0.42 V) when the output voltage Vout is 1.47 V. In the FAST mode (Vtn=0.39 V), the delay time is equal to that in TYP (Vtn=0.42 V) when the output voltage Vout is 1.33 V. The power supply voltage ratio is given by 1.47/1.33=1.11. In order that the (2×Vtn+Voffset) ratio is equal to 1.11, the offset voltage is equal to 0.4 V. At this time, m=1.12. Table 1 and FIG. 7 show these data and comparative results in case where the offset voltage is 0.2 V, 0.4 V, and 0.6 V.

TABLE 1

| offset voltage | threshold voltage Vt | 2 × Vt + Voffset | m | output voltage Vout | delay time |
|---|---|---|---|---|---|
| 0.2 | 0.39 | 0.98 | 1.35 | 1.323 | 2.92 |
| 0.2 | 0.42 | 1.04 | 1.35 | 1.40 | 2.86 |
| 0.2 | 0.45 | 1.10 | 1.35 | 1.485 | 2.80 |
| 0.4 | 0.39 | 1.18 | 1.12 | 1.33 | 2.89 |
| 0.4 | 0.42 | 1.25 | 1.12 | 1.40 | 2.86 |
| 0.4 | 0.45 | 1.31 | 1.12 | 1.47 | 2.85 |
| 0.6 | 0.39 | 1.38 | 0.97 | 1.338 | 2.86 |
| 0.6 | 0.42 | 1.44 | 0.97 | 1.40 | 2.86 |
| 0.6 | 0.45 | 1.50 | 0.97 | 1.455 | 2.90 |

In case of the constant power supply voltage (1.4 V), the delay time of the delay circuit has a variation of 18%. According to this embodiment, the variation is as small as 1% when the offset voltage is 0.4 V Thus, it is possible to completely compensate the variation in delay time with respect to the variation in threshold voltage. When the offset voltage is higher, i.e., 0.6 V, the delay time when the manufacturing variation is the FAST model is smaller (or earlier). This relationship is called forward dependency. On the contrary, when the offset voltage is lower, i.e., 0.2 V, the delay time when the manufacturing variation is the FAST model is greater (or later). Such relationship is called backward dependency. When the value of m is not greater than 1, the resistors are not connected to the ground potential but connected to a certain positive power supply voltage and the resistance split ratio is changed.

In this embodiment, the delay circuit has the delay time dominated by either the NMOS transistors or the PMOS transistors, The power supply voltage level generating circuit generates the reference voltage dependent upon the manufacturing variation. The reference voltage is multiplied by m to produce the power supply voltage for the delay circuit. With the above-mentioned structure, the delay circuit capable of preventing the variation in delay time due to the manufacturing variation and the semiconductor device having the delay circuit are obtained.

Second Embodiment

Figure 8:
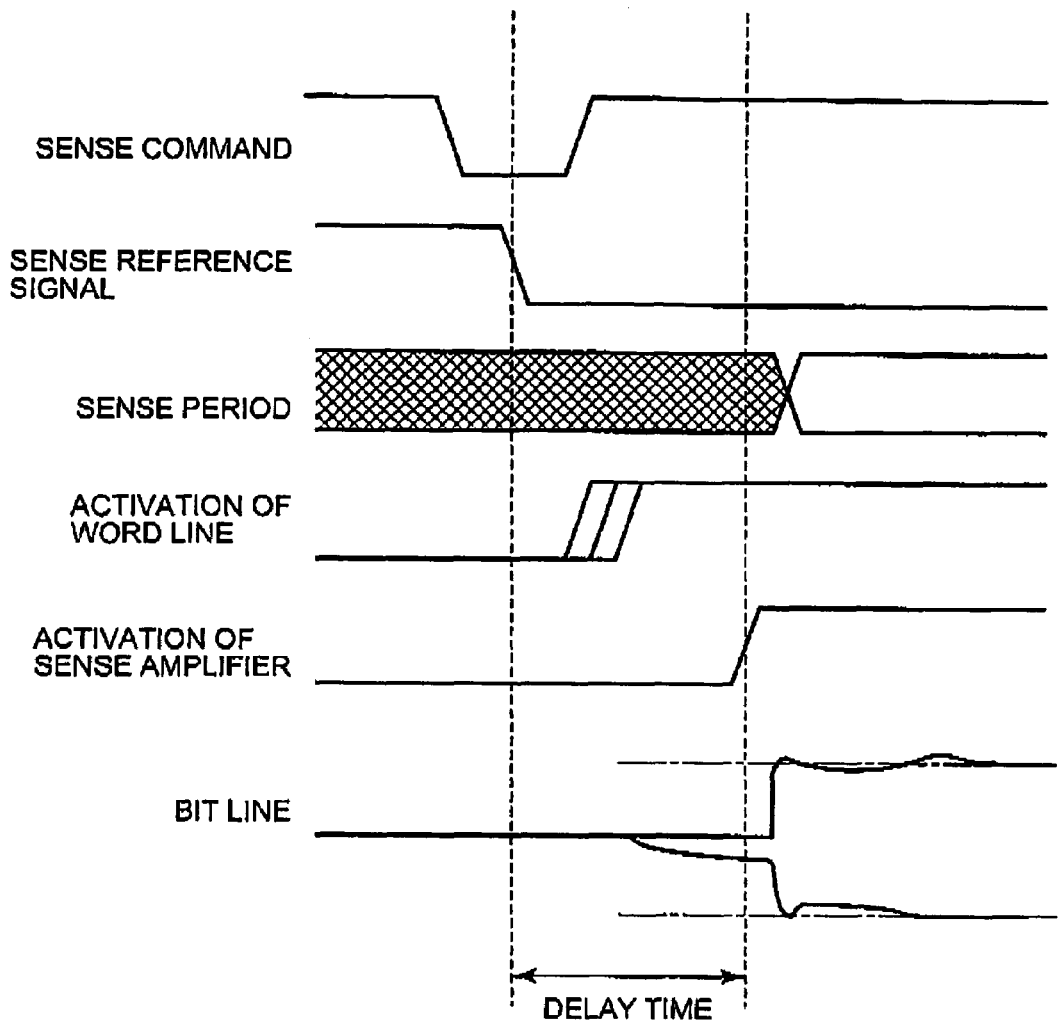
FIG. 8 is a timing chart for describing a second embodiment of this invention.

Referring to FIG. 8, a second embodiment will be described, In this embodiment, a delay circuit according to this invention is used in a semiconductor memory. The semiconductor memory has a readout access time determined by the standard. Even in presence of manufacturing variation, a readout operation must be performed within a predetermined time period. Therefore, a time period from reception of a readout (sense) command from an outside to activation of a sense amplifier must always be kept constant in order to assure a stable operation of the semiconductor memory.

Referring to FIG. 8, the readout operation of the semiconductor memory will be described. The sense command is supplied to start the readout operation. A sense reference signal is inverted and a selected word line is activated. Information of a selected memory cell is read to a bit line as a small signal (that is, a small bit line signal). The sense reference signal is delayed by the delay circuit by a predetermined delay time Into a delayed sense reference signal. The sense amplifier is activated by the delayed sense reference signal. The bit line signal is amplified by the sense amplifier to produce an amplifier output having a high level or a low level. The amplifier output is read out and outputted through an input/output circuit.

The sense reference signal is delayed by the delay circuit by the predetermined delay time and thereafter activates the sense amplifier to read the bit line signal. If the delay time is too short (or early), the sense amplifier can not read a small potential of a bit line potential. If the delay time is too long (or late) on the contrary, the readout operation can not be completed within the time period determined by the standard. Preferably, the delay time must be coincident with the time period determined by the standard. By the use of a fixed delay time, the semiconductor memory can perform a stable operation.

In this embodiment, the delay circuit for giving a fixed delay time is used for the readout operation of the semiconductor memory. However, without being limited to this embodiment, semiconductor devices have various timings determined by the standard. Therefore, the delay circuit capable of giving a fixed delay time even in presence of the manufacturing variation is required for various types of semiconductor devices. With the structure of this invention, the delay circuit for giving a fixed delay time independent from the manufacturing variation and the semiconductor device having the delay circuit are obtained.

While this invention has thus far been described in conjunction with the preferred embodiments, it will readily be understood that this invention is not restricted to the foregoing embodiments but may be appropriately modified in various manners within the scope of this invention.

What is claimed is:

1. A power supply voltage step-down circuit comprising:
    a level generating circuit which adds an offset voltage to a manufacturing variation dependent voltage and outputs a resulting variable reference voltage;
    an m-time voltage generating circuit which multiplies the reference voltage by m, where m is a positive number, and outputs the resulting multiplied voltage.

2. The power supply voltage step-down circuit as claimed in claim 1, wherein the level generating circuit comprises a differential amplifier and an output stage, the output stage comprising a transistor supplied with an output of the differential amplifier, a plurality of transistors each of which is diode-connected, and a constant current source, wherein the transistors, the diode-connected transistors, and the constant current source are connected in sequence between a power supply voltage and an internal power supply voltage, the differential amplifier being supplied with the offset voltage and a potential of a connection point of the constant current source and the diode-connected transistors.

3. The power supply voltage step-down circuit as claimed in claim 1, wherein the m-time voltage generating circuit comprises a differential amplifier and an output stage, the output stage comprising a transistor supplied with an output of the differential amplifier and resistors, the differential amplifier being supplied with an output of the level generating circuit and a potential of a split node of the resistors.

4. A power supply voltage step-down circuit comprising a level generating circuit for generating a reference voltage obtained by adding an offset voltage and a manufacturing variation dependent voltage and an m-time voltage generating circuit for producing a voltage obtained by multiplying the reference voltage by m, where m is a positive number,
    wherein the manufacturing variation dependent voltage is equal to n times a threshold voltage of a MOS transistor, where n is a positive integer.

5. A delay circuit comprising a plurality of stages of inverter circuits in each of which a delay time is dominated by a PMOS or an NMOS transistor, the inverter circuits being supplied with, as a variable power supply voltage, a voltage obtained by adding an offset voltage and a manufacturing variation dependent voltage to produce a variable reference voltage and multiplying the variable reference voltage by m, where m is a positive number.

6. A delay circuit comprising a plurality of stages of inverter circuits in each of which a delay time is dominated by a PMOS or an NMOS transistor, the inverter circuits being supplied with, as a power supply voltage, variable output voltage from a power supply voltage step-down circuit comprising a level generating circuit for generating a variable reference voltage obtained by adding an offset voltage and a manufacturing variation dependent voltage and a m-time voltage generating circuit for producing a variable voltage obtained by multiplying the variable reference voltage by m, where m is a positive number.

7. The delay circuit as claimed in claim 6, wherein the power supply voltage step-down circuit determines the offset voltage and the value of m from a power supply voltage value at which the delay time is substantially same in a manufacturing variation best condition and a manufacturing variation worst condition, the power supply voltage step-down circuit producing a high power supply voltage in a condition that the delay time of the delay circuit is large and a lower power supply voltage in a condition that the delay time of the delay circuit is small.

8. A delay circuit comprising a plurality of stages of inverter circuits in each of which a delay time is dominated by a PMOS or an NMOS transistor, the inverter circuits being supplied with, as a power supply voltage, an output voltage from a power supply voltage step-down circuit comprising a level generating circuit for generating a reference voltage obtained by adding an offset voltage and a manufacturing variation dependent voltage and an m-time voltage generating circuit for producing a voltage obtained by multiplying the reference voltage by m, where m is a positive number, wherein the manufacturing variation dependent voltage is equal to n times a threshold voltage of the MOS transistor dominating the delay time of the delay circuit, where n is a positive integer.

9. A semiconductor device comprising a delay circuit and a power supply voltage step-down circuit, the delay circuit comprising a plurality of stages of inverter circuits in each of which a delay time is dominated by a PMOS or an NMOS transistor, the power supply voltage step-down circuit comprising a level generating circuit for generating a variable reference voltage obtained by adding an offset voltage and a manufacturing variation dependent voltage and a m-time voltage generating circuit for producing a variable voltage obtained by multiplying the reference voltage by m, where m is a positive number, the delay circuit being supplied with, as a power supply voltage, a variable output voltage of the power supply voltage step-down circuit.

10. The semiconductor device as claimed in claim 9, wherein a sense amplifier activation signal is delayed by the delay circuit.

* * * * *